(12) United States Patent
Torres et al.

(10) Patent No.: US 7,205,822 B2
(45) Date of Patent: Apr. 17, 2007

(54) CONTROL CIRCUIT FOR AN INDUCTIVE LOAD DRIVER

(75) Inventors: Antonino Torres, Catania (IT); Giovanni Luca Torrisi, Catania (IT)

(73) Assignee: STMicroelectronics S.R.L., Agrate Brianza (MI) (IT)

( * ) Notice: Subject to any disclaimer, the term of this patent is extended or adjusted under 35 U.S.C. 154(b) by 0 days.

(21) Appl. No.: 10/989,102

(22) Filed: Nov. 15, 2004

(65) Prior Publication Data

US 2005/0162803 A1    Jul. 28, 2005

(30) Foreign Application Priority Data

Nov. 28, 2003    (EP) .................................. 03425763

(51) Int. Cl.
*H03K 17/687*    (2006.01)
(52) U.S. Cl. ........................ 327/427; 327/430; 327/112
(58) Field of Classification Search ................ 327/110, 327/427, 430
See application file for complete search history.

(56) References Cited

U.S. PATENT DOCUMENTS

| | | | | |
|---|---|---|---|---|
| 5,789,951 A * | 8/1998 | Shen et al. | .................. | 327/110 |
| 6,054,890 A * | 4/2000 | Giacomo | .................... | 327/375 |
| 6,057,728 A * | 5/2000 | Igarashi | ..................... | 327/546 |
| 6,304,472 B1 * | 10/2001 | Nagasu et al. | ................ | 363/97 |
| 6,720,819 B1 * | 4/2004 | Yamamoto | ................... | 327/427 |
| 6,734,713 B1 * | 5/2004 | Magoon et al. | ............ | 327/382 |
| 6,891,707 B2 * | 5/2005 | Hiyama et al. | ........... | 361/93.1 |
| 2002/0109417 A1 | 8/2002 | Torrisi et al. | | |
| 2003/0116149 A1 | 6/2003 | Kohno et al. | | |

FOREIGN PATENT DOCUMENTS

EP    1 355 063 A1    10/2003

OTHER PUBLICATIONS

Palara, et al "Modern Electronic Ignition in VIPower Technology"; Power Semiconductor Devices and ICS; Proceedings of the 5$^{the}$ International Symposium on Monterey, CA; May 18, 1993; pp. 218-222; IEEE, New York, NY.
European Search Report; EP 03 42 5763.

* cited by examiner

*Primary Examiner*—My-Trang Nu Ton
(74) *Attorney, Agent, or Firm*—Hogan & Hartson LLP

(57) ABSTRACT

A control circuit for an inductive load driver includes a control block activated by a trigger signal and an output coupled to the control terminal of a power element. The control circuit includes an auxiliary current generator capable of delivering a current that is added to the current provided by control block and the sum of these currents is provided to the control terminal of the power element. The auxiliary current generator enables the inductive load driver to operate normally even though the trigger voltage is less than an optimal voltage value.

19 Claims, 7 Drawing Sheets

CONTROL CIRCUIT FOR AN INDUCTIVE LOAD DRIVER

FIELD OF THE INVENTION

The present invention relates to a control circuit for an inductive load driver suitable for use in electronic ignition applications and smart power devices.

BACKGROUND OF THE INVENTION

As it is well known in the art, in smart power devices a linear control circuit is generally capable of driving a power element and allowing the highest voltage and deliverable current to be provided and diagnostic functions to be performed. These smart power devices are powered in two different modes. In a first mode, the control circuit receives a trigger signal and is powered by a battery. In a second mode, the control signal receives a trigger signal, and is also powered by the trigger signal, and is not coupled to the battery.

In particular, FIG. 1(a) shows a known solution. A control block 1 drives a first power element, in particular an IGBT transistor TR1 of electronic device 2. Control block 1 is powered by a supply voltage Vbat and activated by a trigger signal $V_{TRIGGER}$.

The first power element TR1 is inserted between a first voltage reference, in particular a supply voltage Vbat and a second voltage reference, for example a ground reference GND. The first power element TR1 has a first conduction terminal, in particular a collector terminal C, coupled to the first voltage reference Vbat, a second conduction terminal, in particular an emitter terminal E, coupled to GND, as well as a control terminal, in particular a gate terminal G coupled to control block 1. The first power element TR1 is also coupled to an inductive load, for example a primary winding 3A of a coil, coupled in turn to the supply voltage reference Vbat and to an igniter plug 3B of the coil itself.

A second power element, in particular an IGBT sensing transistor $TR1_{SENSE}$, and a sensing resistance Rs are coupled in series to each other and in parallel between the terminals C and E of the first power element TR1.

During conduction, the two power elements TR1 and $TR1_{SENSE}$ sink different fractions of the same conduction current $I_{COIL}$.

FIG. 1(b) shows a second known solution. FIG. 1(b) shows a control block 10, which is changed with respect to the control block 1 shown in FIG. 1(a). The supply voltage of block 10 is provided by the voltage at the high state of the trigger signal, as well as being used to activate the control block 10.

For the smart power devices such as those shown in FIGS. 1(a) and 1(b), the lowest and the highest output current $I_{COIL}$ and the lowest and the highest voltage of control signal $V_{TRIGGER}$ are specified. It is necessary that the smart power device 2 shown in FIGS. 1(a) and 1(b) correctly operates even in the worst case operating situations. A worst case operating situation occurs for low battery voltages Vbat at extreme temperatures, when the trigger voltage $V_{TRIGGER}$, at the high state, can be reduced. For example, the signal ground can be separated from the power ground, and the real voltage being applied between the gate G and emitter E terminals of the first power element TR1 is further reduced by the voltage drop ΔV introduced by connection cables and connectors.

FIG. 2 shows the same control block 10 of FIG. 1(b), wherein the voltage drop ΔV introduced by cables and connectors is shown.

For electronic ignition applications, in the automotive field, under "normal" operating conditions, it is traditionally required that a power element, in the case of FIG. 2 the first power element TR1, is capable of delivering an output current $I_{COIL}$ no lower than 17 amperes, with a trigger signal $V_{TRIGGER}$ at the input of the block whose level is equal to 5 volts. Under worst case operating conditions, however, the voltage value of the trigger signal $V_{TRIGGER}$ can be reduced down to 2.5 volts.

In the non-limiting case wherein the power element TR1 is an IGBT transistor, the highest voltage applied on the gate terminal G is given by the trigger voltage $V_{TRIGGER}$ minus the voltage drop ΔV introduced by the control block 10. This voltage also determines the highest output current $I_{COIL}$ deliverable by smart power device 2.

In this situation, it is very difficult to meet the required specification concerning the minimum output current $I_{COIL}$ of 17 amperes, with the reduced-voltage trigger signal $V_{TRIGGER}$, unless an IGBT transistor with an oversized area is used.

FIGS. 3(a) and 3(b) shows, in a series of graphs, signals related to simulations on the circuit of FIG. 2 performed for the first power element TR1. In particular an IGBT transistor whose active area is equal to 10 mm², driven by the control block 10 limiting the output current $I_{COIL}$ to 20 amperes was used.

FIG. 3(a) relates to the case of the trigger voltage $V_{TRIGGER}$ at the high state of 2.5 volts and FIG. 3(b) shows the simulation results as the amplitude of the voltage varies.

When the trigger voltage $V_{TRIGGER}$ is 2.5 volts [V(TRIGG_1)], the output current I(COIL_1) stays lower than 4 amperes, which is quite lower than the predetermined limitation current, since the actual voltage V(GATE_1) calculated on the gate terminal G corresponds to about 2.3 volts.

When the trigger signal $V_{TRIGGER}$ reaches a low state, the IGBT transistor TR1 is disabled and the power accumulated in the primary winding 3A of a coil transfers to the secondary winding generating a spark on the igniter plug 3B.

When the current in the collector terminal C of the IGBT transistor TR1 is too low, the accumulated power can be insufficient for generating the mixture combustion in the explosion chamber, with the subsequent misfiring phenomenon which is, as is well known, very damaging for the motor.

From the simulations of FIG. 3(b) it can thus be appreciated how the current $I_{COIL}$, to reach the limitation value of 20 amperes, requires a trigger signal $V_{TRIGGER}$ whose amplitude is no lower than 4 volts.

To overcome the above-mentioned problems, the prior art suggests the use of a charge pump fed by a trigger signal $V_{TRIGGER}$, capable of generating an output voltage being sufficiently high as to conveniently bias the gate terminal G of the IGBT transistor TR1, allowing thus the current $I_{COIL}$ required by the application to be delivered therefrom.

Although this solves the problem, the solution has a serious drawback. The noise generated by the inner oscillator of the charge pump can cause electromagnetic noise making the device incompatible with emission regulations.

Moreover, this noise, which is also reflected on the voltage of collector terminal C, is transferred to the coil secondary winding, by means of the turn ratio, which can generate undesired overvoltages.

To address these problems, it would be thus necessary to further increase the circuit complexity of the control block 10 by inserting filters.

What is desired, therefore, is a control circuit for a smart power device having a reduced amplitude trigger signal, such that a sufficiently high current is produced to avoid ignition problems, but overcomes the problems associated with the prior art solutions described above.

SUMMARY OF THE INVENTION

According to an embodiment of the present invention, an auxiliary current generator capable of delivering an auxiliary current is added to the current output of the control circuit in order to bias, according to the provided specifications, the control terminal of an IGBT power element.

According to an embodiment of the present invention a control circuit for an inductive load driver includes a control block for receiving a trigger signal ($V_{TRIGGER}$) and an output coupled to a control terminal of a power element such as an IGBT transistor. An auxiliary current generator delivers a current that is added to the current output by the control block to supply a driving current $I_{GATE}$ to the power element.

According to an embodiment of the present invention, the control block of the inductive load driver is not coupled to an external power supply, so that it can be assembled in simpler and cheaper packages like three pin packages.

BRIEF DESCRIPTION OF THE DRAWINGS

The aforementioned and other features and objects of the present invention and the manner of attaining them will become more apparent and the invention itself will be best understood by reference to the following description of a preferred embodiment taken in conjunction with the accompanying drawings, wherein.

DETAILED DESCRIPTION

Figure 5:
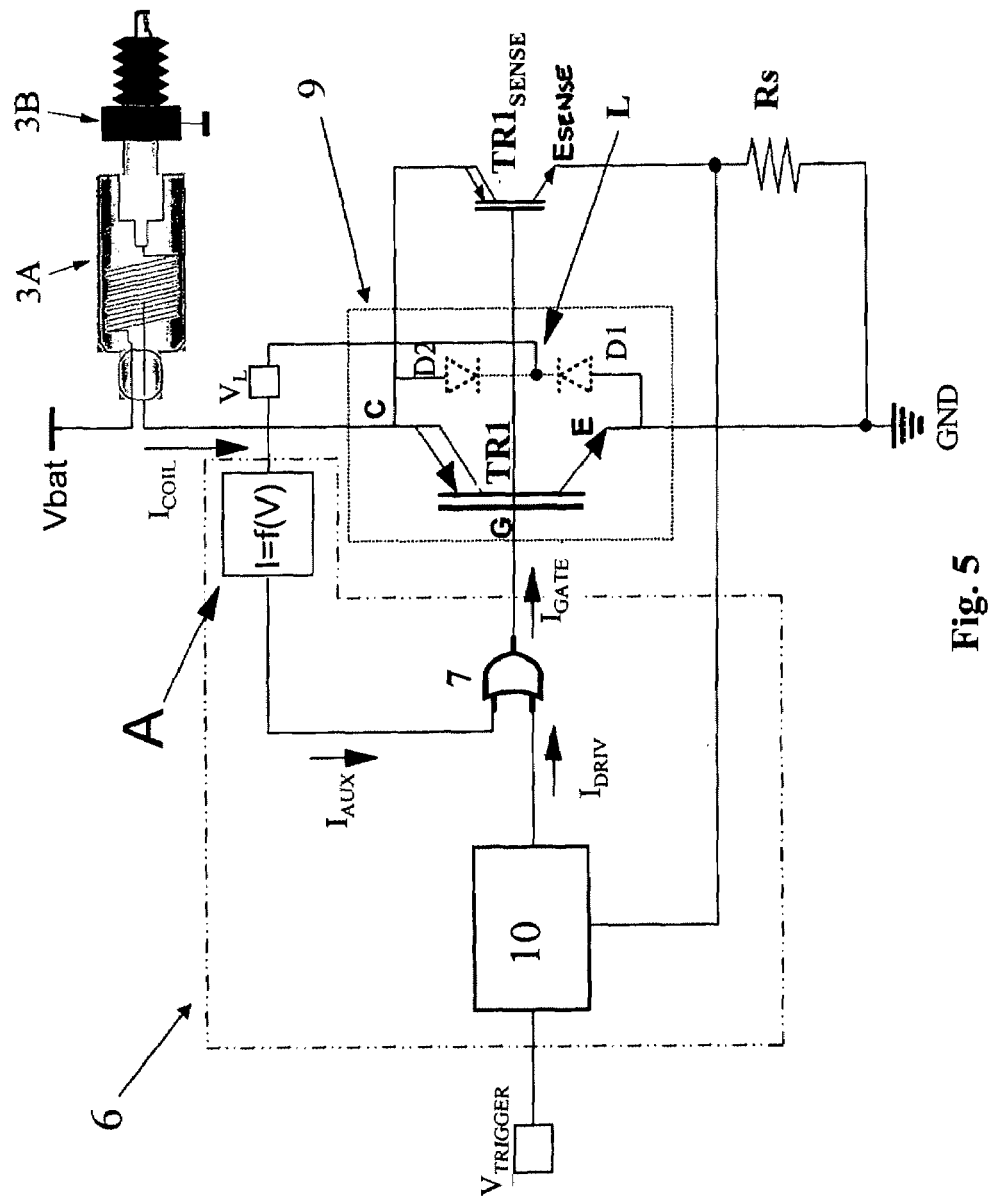
FIG. 5 schematically shows a control circuit according to an embodiment of the present invention for a power element of an inductive load driver.

FIG. 5 shows a control circuit 6 receiving at its input a trigger signal $V_{TRIGGER}$ and a collector voltage value $V_L$ and outputting a current value $I_{GATE}$ driving a first power element, particularly an IGBT transistor TR1 of an inductive driver circuit 9.

In particular, control circuit 6 comprises a control block 10 receiving, as in the prior art, at its input the trigger signal $V_{TRIGGER}$ and generating a first current $I_{DRIV}$.

Control circuit 6 also comprises, according to the invention, a current generator block A receiving at its input voltage $V_L$ and producing a second current, in particular an auxiliary current $I_{AUX}$.

According to the invention, the input voltage $V_L$ of the control circuit 6, by means of the auxiliary current $I_{AUX}$ generator block A, is detected at node L, which is the cathode terminal common to two intrinsic diodes D1 and D2 located in series between the collector and the emitter of the power element TR1 of the inductive driver device 9.

Figure 1:
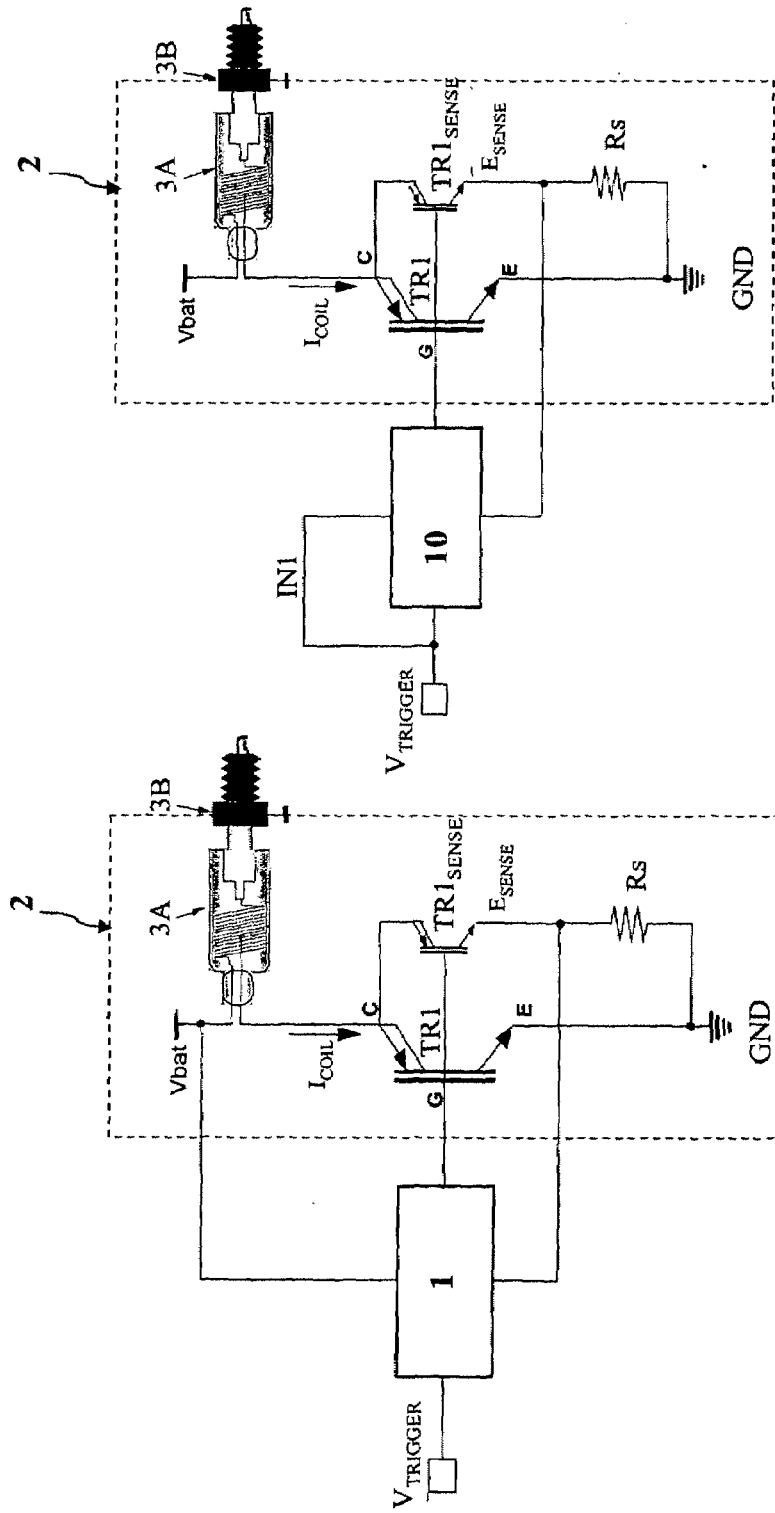
FIG. 1a schematically shows a first control block, fed by a battery, driving a power element of an electronic device driving an inductive load, according to the prior art.
FIG. 1b schematically shows a second control block, fed by a trigger signal, driving the power element of the electronic device driving an inductive load, according to the prior art.
Figure 2:
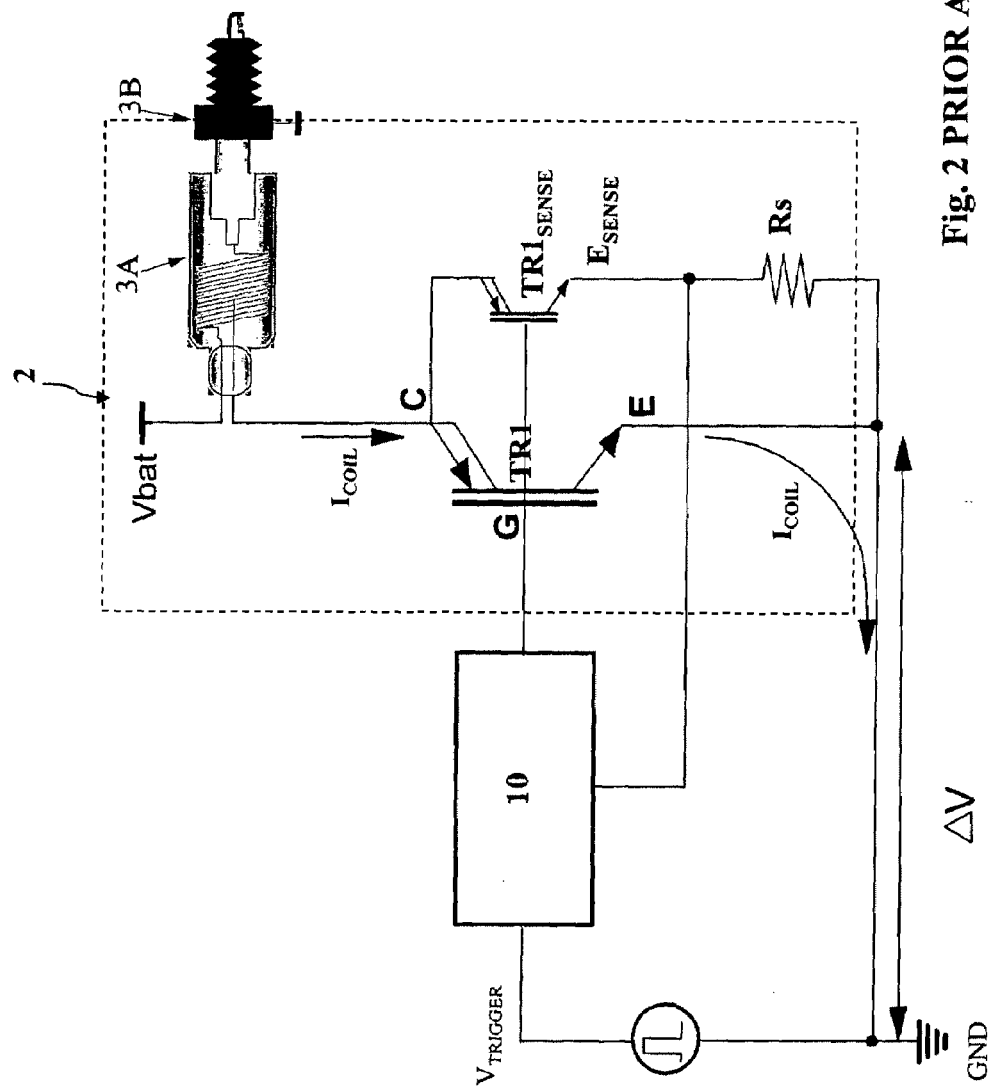
FIG. 2 schematically shows the second control block, fed by the trigger signal, driving the power element of the electronic device and wherein a voltage drop introduced by cables and connectors is also shown, according to the prior art.
Figure 3B:
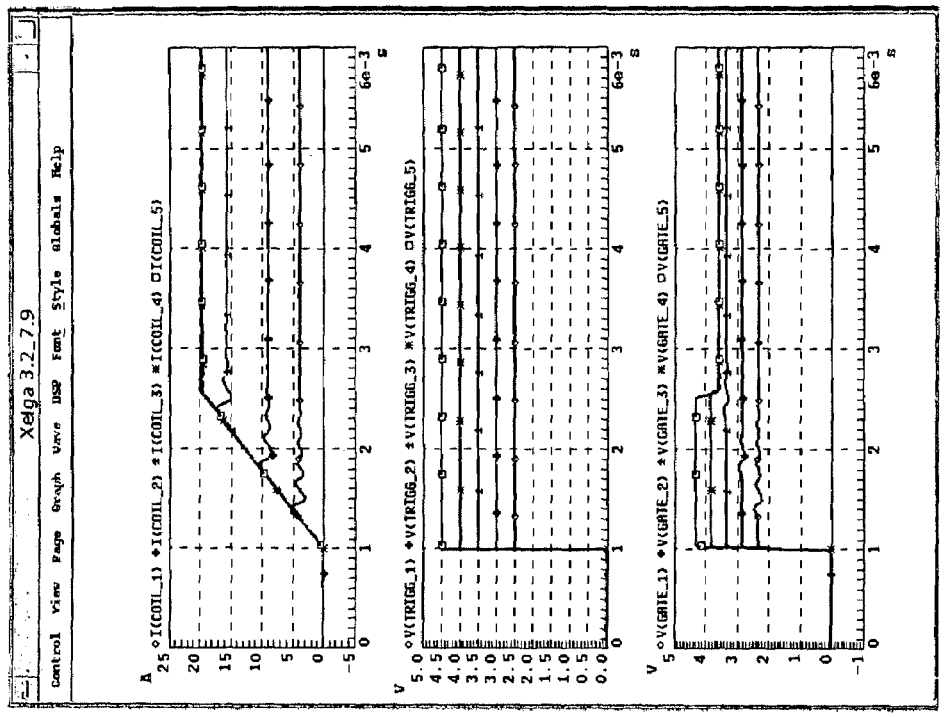
FIGS. 3(a) and 3(b) are timing diagrams that show the evolution of voltage and current waveforms obtained by simulating the operation of the electronic device of FIG. 2, according to the prior art.
Figure 3A:
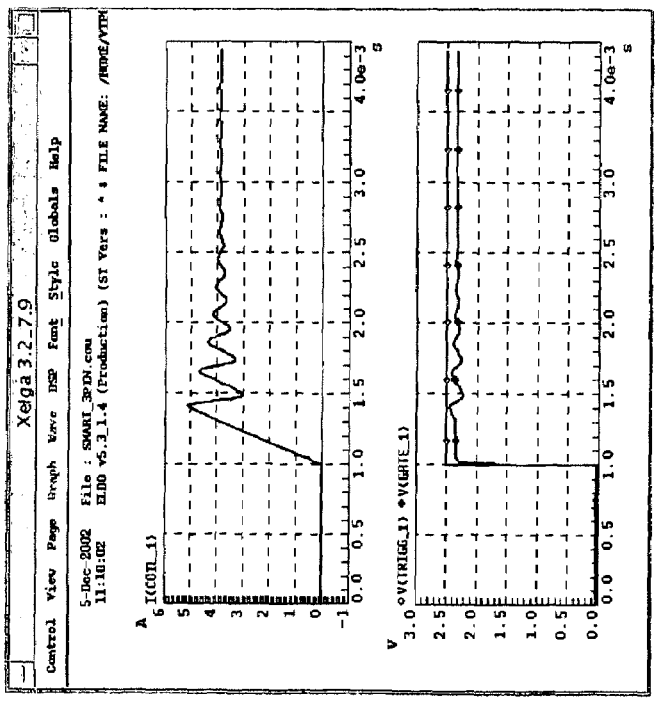
Figure 4:
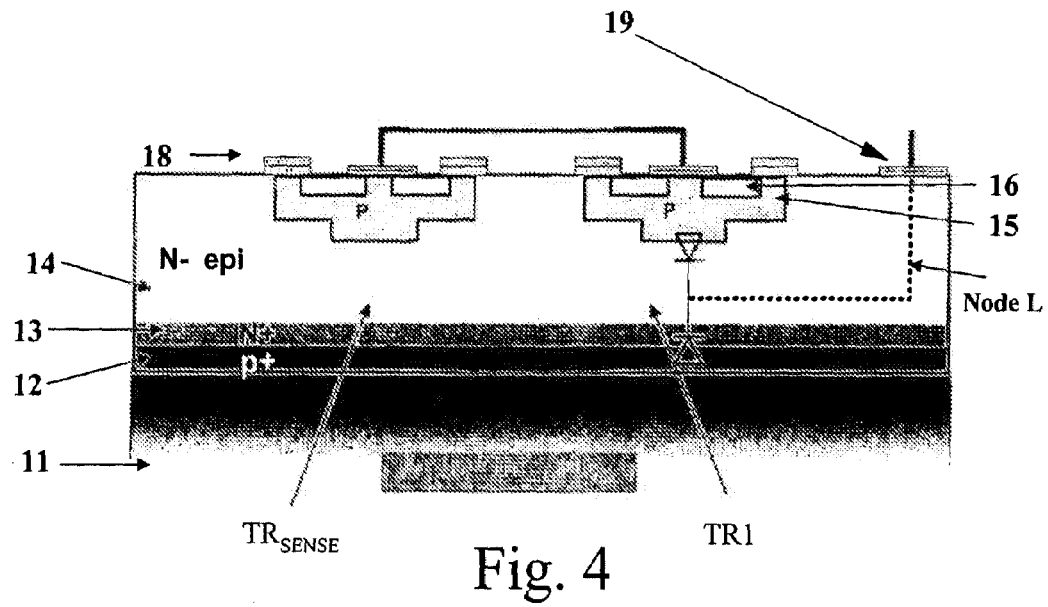
FIG. 4 is a cross-sectional diagram of a portion of a semiconductor integrated circuit comprising a power element and bonding pad for the extraction of a collector voltage value.

Voltage $V_L$ is proportional to the collector voltage of power element TR1 and it is produced in an area located in the physical structure of the transistor itself as is shown in detail in FIG. 4.

Referring again to FIG. 5, according to the present invention, the contributions of the currents—first $I_{DRIV}$ and second $I_{AUX}$—are added, by means of a logic OR gate 7, and they output a current $I_{GATE}$ to control the power element TR1 of inductive load driver 9.

Power element TR1 is associated, as already described in the prior art, to a second power element, in particular an IGBT sensing transistor $TR_{SENSE}$.

FIG. 4 shows the structure used to provide voltage $V_L$ from the IGBT transistor TR1 of inductive load driver 9, which is coupled to block A, which in turn provides the auxiliary current $I_{AUX}$. FIG. 4 shows an integrated structure comprising the first power element TR1 as well as the sensing transistor $TR_{SENSE}$. A bonding pad 19 is also provided near the edge structure of power element TR1 in order to provide the value of voltage $V_L$.

The composite structure of the transistor TR1 comprises, a collector layer 11, a heavily doped P+ semiconductor layer 12, and a heavily doped N+ semiconductor layer 13.

On semiconductor layer 13 a weakly doped N− epitaxial layer 14 is formed including P-type wells 15. Pairs of N-type active areas with electrodes 18 are formed in wells 15.

Additional pad 19 is located on the edge of the transistor TR1 structure. Using pad 19, the voltage $V_L$ of the transistor is provided, which is brought back to the input of the auxiliary current $I_{AUX}$ generator block A.

FIG. 4 also shows diodes D1 and D2 coupled together with a common cathode coupled to node "L".

Figure 6:
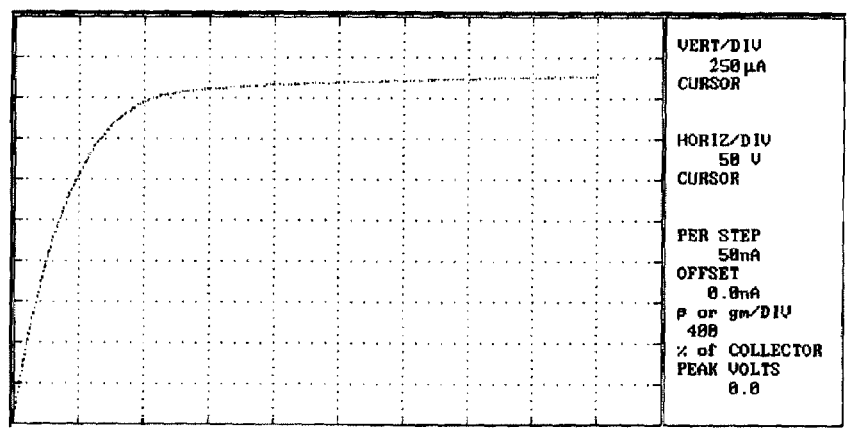
FIG. 6 shows a typical operating curve of a JFET structure for being integrated inside the control circuit, according to the present invention.

According to an embodiment of the present invention, by using high voltage technology, such as VIPower® technology, the auxiliary current $I_{AUX}$ generator block A can be realised with a J-FET transistor structure [(I=f(V)] integrated inside the control circuit 6. This solution has the advantage of pinching at high voltage, as shown in the curve of FIG. 6.

Figure 7:
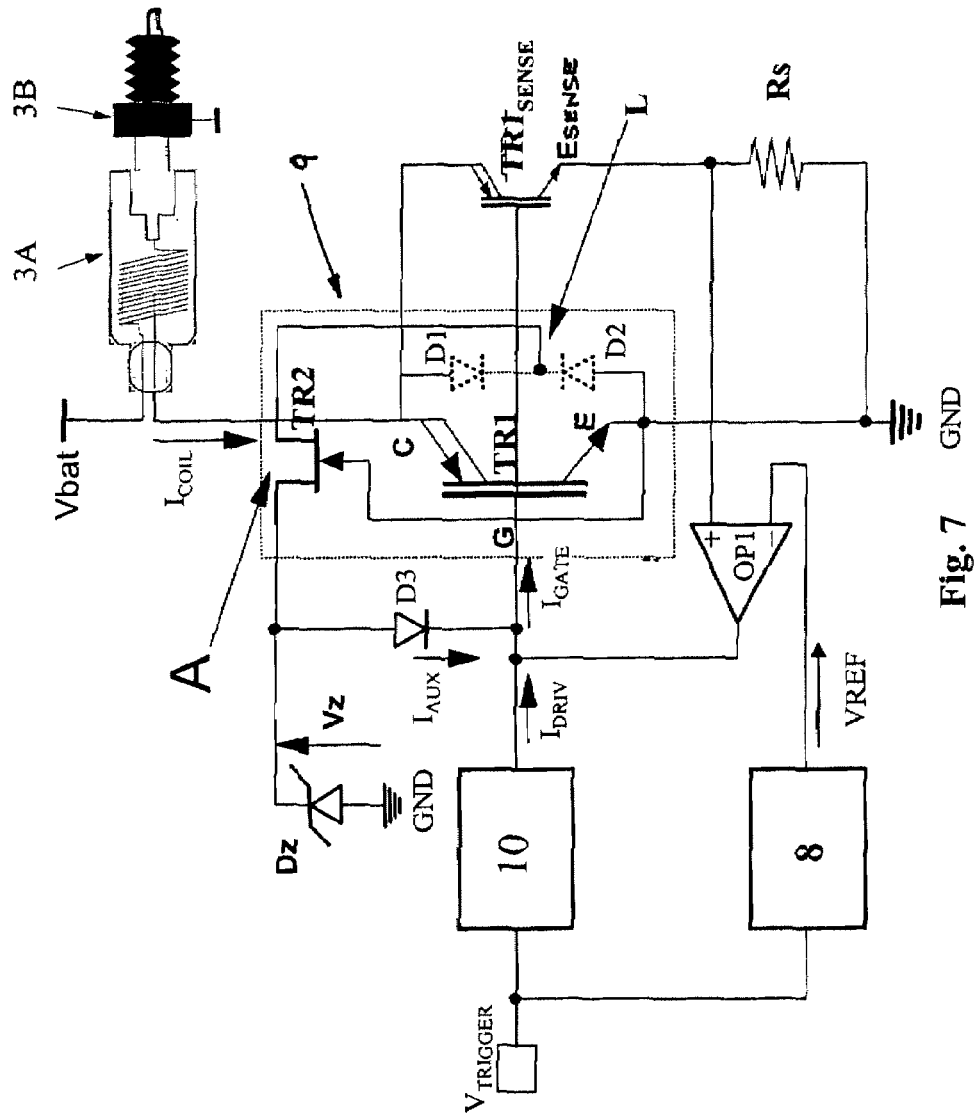
FIG. 7 schematically shows a testing circuit for the optional evaluation of a particular configuration of the control circuit of FIG. 5, according to the present invention.

Referring now to FIG. 7, a second possible optional solution to realise the auxiliary current $I_{AUX}$ generator block A is the use of a third power element, in particular a JFET transistor TR2 which can be integrated inside the same IGBT transistor TR1 of inductive load driver 9. According to the present invention, in this case, the control circuit 6 can be realised with low voltage technology.

As can be appreciated in FIG. 7, block A has been realised with a JFET transistor TR2 monolithically integrated inside the IGBT transistor TR1 of the inductive load driver 9.

In the evaluation circuit of the effectiveness of this second solution shown in FIG. 7, the JFET transistor TR2 has the control terminal coupled to the emitter E of transistor TR1, a first conduction terminal connected to the cathode node L being common to the two intrinsic diodes D1 and D2, and a second conduction terminal coupled to the gate terminal G of the transistor TR1 of the inductive load driver 9. A diode D3 is inserted between the second conduction terminal of the JFET transistor TR2 and the gate terminal G of the transistor TR1, while a Zener diode Dz is coupled between the second conduction terminal of the JFET transistor TR2 and GND.

An operational amplifier OP1 is also provided, serving as current limiter, with an inverting input (−) coupled to a generator block 8 of reference voltage VREF, receiving at its input the trigger signal $V_{TRIGGER}$, a non-inverting input (+) coupled to the emitter terminal $E_{SENSE}$ of the sensing transistor TR$1_{SENSE}$, and an output coupled to the gate terminal G of transistor TR1.

The voltage reference block 8 and the operational amplifier OP1 serving as current limiter allow the limitation function of the highest current output from the first transistor TR1 to be provided.

To implement the evaluation circuit of the effectiveness of this second solution shown in FIG. 7, it is necessary that control block 10 have the following features: it delivers the current $I_{DRIV}$ when the input voltage $V_{TRIGGER}$ is higher than the output voltage thereof, coinciding with the voltage Vg of the control terminal G of the transistor TR1; and it does not absorb current, similarly to a diode.

Figure 8B:
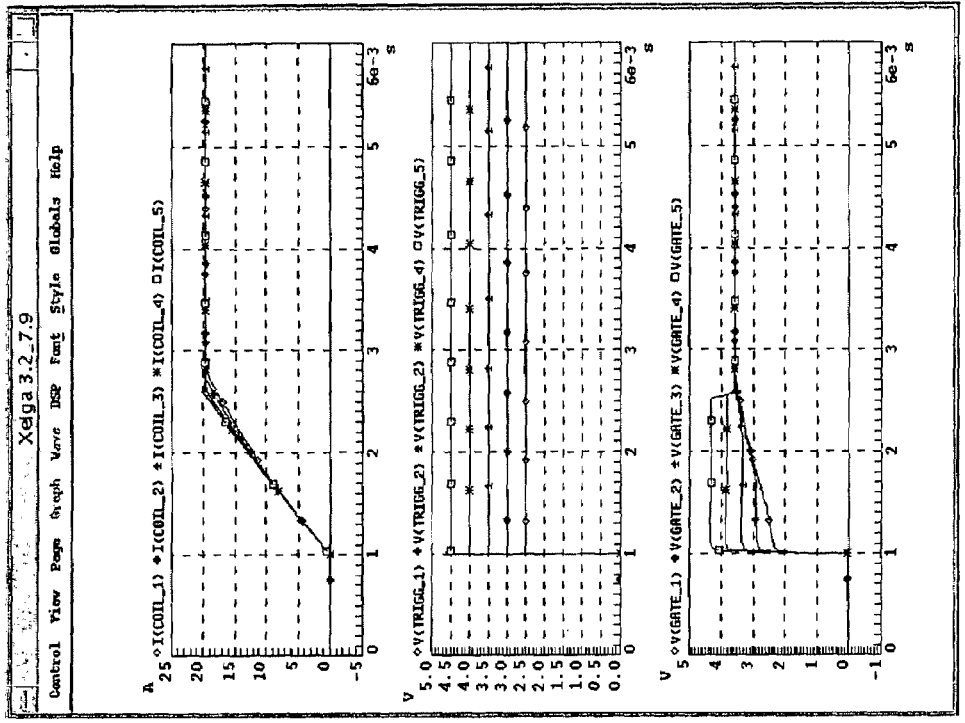
FIGS. 8(a) and 8(b) show the result of the simulation of the circuit of FIG. 7.
Figure 8A:
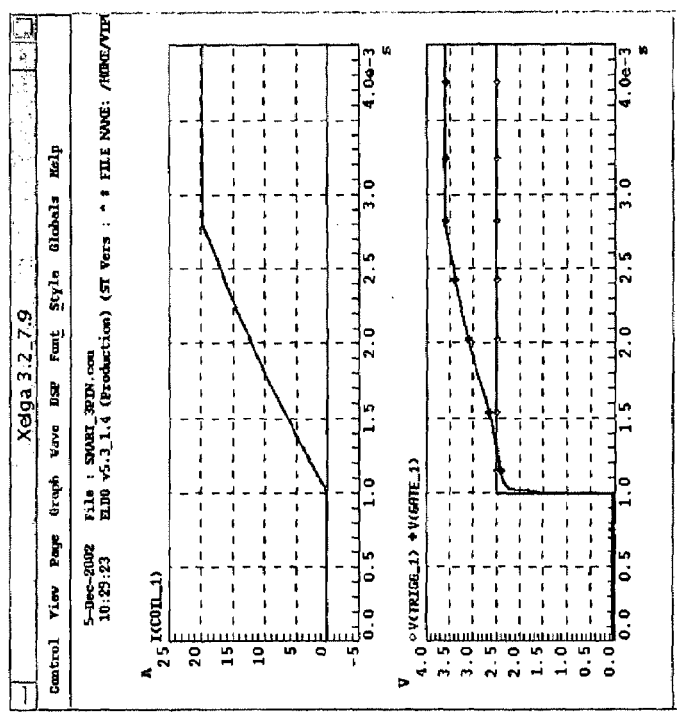

FIGS. 8(*a*) and 8(*b*) show the result of the simulation of the circuit of FIG. 7. In FIG. 8(*a*) the voltage V(GATE_1), which can be applied on the control terminal G of the transistor TR1, can overcome the trigger voltage V(TRIGG_1) at the high state, which is the supply voltage of the control block, allowing the transistor TR1 to operate with a high output current.

The control terminal G capacitance is charged in two following steps: in a first step the current $I_{DRIV}$ charges the control terminal G of transistor TR1, until the gate voltage is lower than the V_TRIGGER voltage at the high state; and in a second step, when $I_{DRIV}$ is zero, the control terminal G of transistor TR1 is charged only by current $I_{AUX}$ coming from the JFET transistor TR2.

The voltage on control terminal G of transistor TR1 is at the end limited by operational amplifier OP1 serving as current limiter, operating in adjustment, in order to have the predetermined coil current I(COIL_1).

In FIG. 8(*b*) the limitation current is always reached, as the amplitude of the trigger voltage $V_{TRIGGER}$ varies. As the amplitude of the signal $V_{TRIGGER}$ varies, the corresponding voltage V(GATE) of the control terminal G of the transistor TR1 reaches a value which is sufficient to let the collector current reach the limitation value.

This type of solution allows the device to reach the nominal current even in the worst case, in order to always charge the coil in an optimal way, and to have in the turn-off step the convenient amount of energy available.

According to an embodiment of the present invention a control circuit is provided for power devices driven by input signals having, at a high logic state, a non-optimal voltage value.

While there have been described above the principles of the present invention in conjunction with a preferred embodiment thereof, it is to be clearly understood that the foregoing description is made only by way of example and not as a limitation to the scope of the invention. Particularly, it is recognized that the teachings of the foregoing disclosure will suggest other modifications to those persons skilled in the relevant art. Such modifications may involve other features which are already known per se and which may be used instead of or in addition to features already described herein. Although claims have been formulated in this application to particular combinations of features, it should be understood that the scope of the disclosure herein also includes any novel feature or any novel combination of features disclosed either explicitly or implicitly or any generalization or modification thereof which would be apparent to persons skilled in the relevant art, whether or not such relates to the same invention as presently claimed in any claim and whether or not it mitigates any or all of the same technical problems as confronted by the present invention. The applicants hereby reserve the right to formulate new claims to such features and/or combinations of such features during the prosecution of the present application or of any further application derived therefrom.

We claim:

1. A control circuit for an inductive load driver comprising:
   a control block activated by a trigger signal for providing a first current;
   a power element having a control terminal coupled to the control block; and
   an auxiliary current generator including a pinched resistor JFET for providing a second current that is added to the first current to supply a driving current to the control terminal of the power element.

2. The circuit of claim 1, wherein a voltage proportional to a collector voltage of the power element is provided to the auxiliary current generator.

3. The circuit of claim 1, wherein the first and second currents are added by a logic gate.

4. The circuit of claims 3, wherein the logic gate comprises an OR gate.

5. The circuit of claim 1, wherein the power element comprises an IGBT transistor.

6. The circuit of claim 1, wherein the second current is provided from an epitaxial layer of the power element coupled to a pad on the edge structure of the power element.

7. The circuit of claim 1, wherein the components of the control circuit are realised with high voltage technology in excess of 100 volts.

8. The circuit of claim 7, wherein the auxiliary current generator block comprises the JFET integrated inside the control circuit.

9. The circuit of claim 8, wherein the JFET transistor pinches at high voltage of about 100 volts.

10. The circuit of claim 1, wherein the auxiliary current generator block comprises the JFET integrated inside the power element.

11. The circuit of claim 10 further comprising a voltage reference block.

12. The circuit of claim 10 further comprising an operational amplifier operating as current limiter.

13. The circuit of claim 12, wherein the control block delivers the driving current when the trigger signal is higher than the control voltage on the power element.

14. The circuit of claim 12, wherein the control block does not absorb current.

15. An inductive load driver comprising:
a power element, having a control terminal, for providing a current to an inductive load;
a control block for receiving a trigger signal and for providing a first current;
an auxiliary current generator including a pinched resistor JFET coupled to the power element for providing a second current; and
a summing circuit for adding the first and second currents coupled to the control terminal of the power element.

16. The inductive load driver of claim 15 wherein the power element comprises an IGBT transistor.

17. The inductive load driver of claim 15 wherein the control block is not coupled to a battery.

18. The inductive load driver of claim 15 wherein the summing circuit comprises an OR gate.

19. The inductive load driver of claim 15 further comprising a sense transistor coupled to the power element.

* * * * *